United States Patent
Faure

(10) Patent No.: US 8,564,019 B2
(45) Date of Patent: Oct. 22, 2013

(54) HETEROSTRUCTURES COMPRISING CRYSTALLINE STRAIN RELAXATION LAYERS

(75) Inventor: Bruce Faure, Paris (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/341,489

(22) Filed: Dec. 30, 2011

(65) Prior Publication Data

US 2012/0098033 A1      Apr. 26, 2012

Related U.S. Application Data

(62) Division of application No. 12/463,873, filed on May 11, 2009, now Pat. No. 8,105,916.

(30) Foreign Application Priority Data

May 15, 2008   (FR) ..................... 08 53150

(51) Int. Cl.
    *H01L 29/04* (2006.01)
(52) U.S. Cl.
    USPC .......................................... 257/190
(58) Field of Classification Search
    USPC .......................................... 257/190
    See application file for complete search history.

(56) References Cited

U.S. PATENT DOCUMENTS

| | | | |
|---|---|---|---|
| 4,994,867 A | 2/1991 | Biegelsen | |
| 6,794,276 B2 | 9/2004 | Letertre et al. | |
| 6,972,247 B2 | 12/2005 | Bedell et al. | |
| 7,018,909 B2 | 3/2006 | Ghyselen et al. | |
| 7,273,798 B2 | 9/2007 | Lester et al. | |
| 7,282,381 B2 | 10/2007 | Feltin et al. | |
| 8,105,916 B2 * | 1/2012 | Faure ............................ | 438/458 |
| 2003/0064535 A1 | 4/2003 | Kub et al. | |
| 2004/0067622 A1 | 4/2004 | Akatsu et al. | |
| 2004/0192067 A1 | 9/2004 | Ghyselen et al. | |

(Continued)

FOREIGN PATENT DOCUMENTS

| | | |
|---|---|---|
| EP | 651439 A2 | 5/1995 |
| EP | 858110 A1 | 8/1998 |

(Continued)

OTHER PUBLICATIONS

Di Cioccio, L., et al., "III-V layer transfer onto silicon and applications," phys. stat. sol. (a) 202, No. 4, 509-515 (2005).

Hobart, K.D., et al., "Compliant Substrates: A Comparative Study of the Relaxation Mechanisms of Strained Films Bonded to High and Low Viscosity Oxides," Journal of Electronic Materials, vol. 29, No. 7, 2000.

(Continued)

*Primary Examiner* — Matthew W Such
*Assistant Examiner* — Robert Carpenter
(74) *Attorney, Agent, or Firm* — TraskBritt

(57) ABSTRACT

The invention relates to a process for fabricating a heterostructure. This process is noteworthy in that it comprises the following steps: a) a strained crystalline thin film is deposited on, or transferred onto, an intermediate substrate; b) a strain relaxation layer, made of crystalline material capable of being plastically deformed by a heat treatment at a relaxation temperature at which the material constituting the thin film deforms by elastic deformation is deposited on the thin film; c) the thin film and the relaxation layer are transferred onto a substrate; and d) a thermal budget is applied at at least the relaxation temperature, so as to cause the plastic deformation of the relaxation layer and the at least partial relaxation of the thin film by elastic deformation, and thus to obtain the final heterostructure.

11 Claims, 3 Drawing Sheets

(56) References Cited

U.S. PATENT DOCUMENTS

| | | |
|---|---|---|
| 2004/0253792 A1 | 12/2004 | Cohen et al. |
| 2005/0250294 A1 | 11/2005 | Ghyselen |
| 2006/0033119 A1 | 2/2006 | Shibata |
| 2006/0175608 A1 | 8/2006 | Celler |
| 2006/0205180 A1 | 9/2006 | Henley et al. |
| 2006/0211219 A1 | 9/2006 | Henley et al. |
| 2007/0048975 A1 | 3/2007 | Chen et al. |
| 2007/0069225 A1 | 3/2007 | Krames et al. |
| 2007/0072324 A1 | 3/2007 | Krames et al. |
| 2007/0278622 A1 | 12/2007 | Lester et al. |
| 2007/0298549 A1 | 12/2007 | Jurczak et al. |
| 2008/0113496 A1 | 5/2008 | Keller et al. |
| 2008/0169483 A1 | 7/2008 | Kasai et al. |

FOREIGN PATENT DOCUMENTS

| | | |
|---|---|---|
| EP | 1671361 B1 | 4/2007 |
| EP | 1901345 A1 | 3/2008 |
| FR | 2775121 A1 | 8/1999 |
| FR | 2895420 A1 | 6/2007 |

OTHER PUBLICATIONS

Huang, R., et al., "Mechanics of Relaxing SiGe Islands on a Viscous Glass," Acta Mechanica Sinica (English Series), vol. 18, No. 5, Oct. 2002 (XP009112211).

Kostrzewa, M., et al., "Feasibility of Strain Relaxed InAsP and InGaAs Compliant Substrates," International Conference on Indium Phosphide and Related Materials, 2003, pp. 437-440.

Mooney, P.M., et al., "Elastic strain relaxation in free-standing SiGie/Si structures," Applied Physics Letters, vol. 84, No. 7, 1093-1095, Feb. 16, 2004.

Preliminary Research Report of the INPI, FR Application No. 0853150, Dec. 17, 2008, 2 pages.

Yin, H., et al., "Strain relaxation of SiGe islands on compliant oxide," Journal of Applied Physics, vol. 91, No. 12, 9716-9722, Jun. 15, 2002.

Yin, Haizhou, et al., "Buckling suppression of SiGe islands on compliance substrates," Journal of Applied Physics, vol. 94, No. 10, 6875-6882, Nov. 15, 2003.

Yin, Haizhou, et al., "Tunable uniaxial vs biaxial in-plane strain using compliant substrates," Applied Physics Letters 87, 061922 (2005).

* cited by examiner

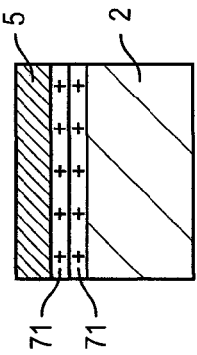
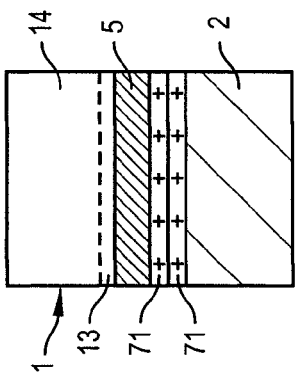
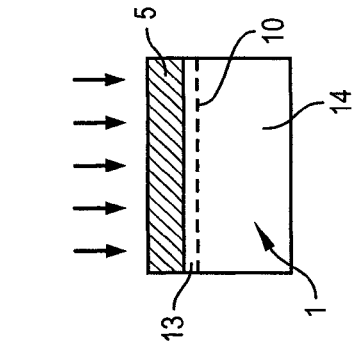
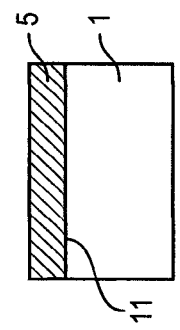
FIG. 1A  FIG. 1B  FIG. 1C  FIG. 1D
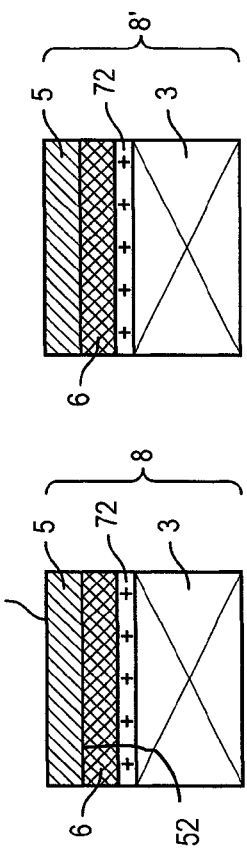
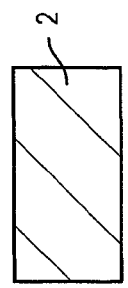
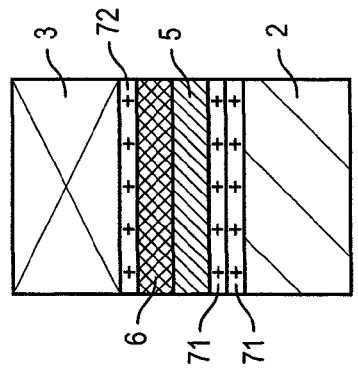
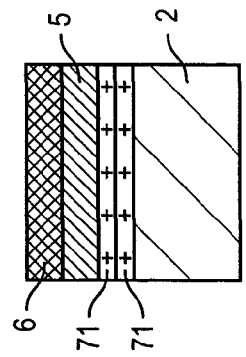
FIG. 1E  FIG. 1F  FIG. 1G  FIG. 1H

US 8,564,019 B2

HETEROSTRUCTURES COMPRISING CRYSTALLINE STRAIN RELAXATION LAYERS

CROSS-REFERENCE TO RELATED APPLICATIONS

This application is a divisional of U.S. patent application Ser. No. 12/463,873, filed May 11, 2009, now U.S. Pat. No. 8,105,916, issued Jan. 31, 2012, which is hereby incorporated herein in its entirety by this reference. Pursuant to the provisions of 35 U.S.C. §119, this application claims priority to French Patent Application Serial No. FR0853150, filed May 15, 2008, which is hereby incorporated herein in its entirety by this reference.

TECHNICAL FIELD

The present invention relates to a heterostructure intended to be used in applications in the fields of optics, optoelectronics, electronics or photovoltaic components, which heterostructure comprises a multilayer stack in which the upper layer is in the relaxed or partially relaxed state.

BACKGROUND

Materials that are not available in bulk form are often fabricated by heteroepitaxy on substrates whose lattice parameter is not perfectly matched. This results in the formation of tensilely or compressively strained materials.

Moreover, when the thickness of the epitaxially grown material exceeds a threshold value, the strains due to the difference in lattice parameter from that of the substrate are such that the epitaxially grown material relaxes, forming dislocations in the crystal lattice during the epitaxy. These dislocations result in atom stacking faults in the volume of the material.

In the case of III/N materials, the dislocations generated by the relaxation are mainly oriented along an axis perpendicular to the plane of the surface of the material. These dislocations are called "through-dislocations," as they pass through the thickness of the layer of the material. They have a deleterious effect on the performance and lifetime of components formed from these materials.

Finally, materials obtained by heteroepitaxy and rich in dislocations constitute poor seed substrates when they are used for a subsequent epitaxy, since the dislocations that they contain are transmitted to the subsequent epilayer.

Already known, from U.S. Patent Application Publication 2004/0192067, is a process for fabricating a heterostructure that includes a relaxed or partially relaxed useful layer on a substrate.

That process consists in transferring, onto a support, a layer of amorphous material, such as $SiO_xN_y$ or $SiO_2$, which may possibly contain dopant elements, such as boron or phosphorus, so as to modify the glass transition temperature of this material in order to make it viscous at the desired temperature. This layer of amorphous material is subjacent to a strained layer. Applying a heat treatment above the glass transition temperature, enabling the material to pass into the viscous state, causes partial or complete relaxation of the previously strained layer.

However, amorphous materials are electrical insulators. Consequently, the properties of the heterostructure obtained are not always optimized for all desired applications.

Moreover, this amorphous layer may contaminate other layers of the heterostructure or electronic devices fabricated thereon, by the diffusion of the dopant elements during subsequent heat treatments.

BRIEF DESCRIPTION OF THE DRAWINGS

Other features and advantages of the invention will become apparent from the following description, with reference to the appended drawings which show, by way of indication but implying no limitation, one possible embodiment.

In these drawings:

FIGS. 1A through 1H are diagrams showing the various successive steps of one possible embodiment of the process for fabricating a heterostructure according to the invention;

DETAILED DESCRIPTION

Figure 2A:
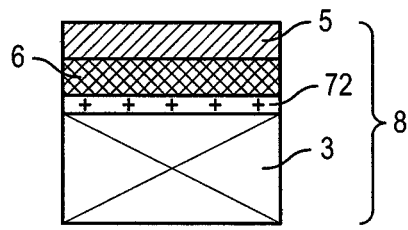
FIGS. 2A through 2D are diagrams showing the various successive steps of a first method of using the heterostructure according to the invention.

The present invention relates to a heterostructure intended to be used in applications in the fields of optics, optoelectronics, electronics or photovoltaic components, which heterostructure comprises a multilayer stack in which an upper layer is in a relaxed or partially relaxed state.

Such a heterostructure may serve, for example, for the manufacture of electronic components such as lasers or LEDs (light-emitting diodes), formed from the upper layer.

Another advantageous application consists in using this heterostructure as an epitaxy substrate in order subsequently to obtain, by epitaxy, relaxed materials of high crystallographic quality, i.e., having a quality sufficient to be able to be used in applications in the aforementioned fields, which materials have, in particular, a very low density of crystal defects, such as dislocations.

The invention also relates to a process for fabricating such a heterostructure.

The invention is particularly applicable in the production of a heterostructure allowing the epitaxy of materials of the III/N type that are not generally available in bulk form.

The expression "materials of the III/N type" is understood to mean any alloy of at least one element belonging to column III of the periodic table with nitrogen or, in other words, any nitride of these elements belonging to column III.

To give an example of such alloys, mention may be made of aluminium nitride (AlN), gallium nitride (GaN), indium nitride (InN), and also ternary or quaternary nitrides, such as AlGaN, AlInN, InGaN and AlInGaN.

One object of the invention is to provide a heterostructure comprising a multilayer stack in which an upper layer is in a relaxed or partially relaxed state, while still being of good crystallographic quality, that is to say, a quality sufficient to allow optimum operation of electronic, optoelectronic or photovoltaic components.

Another object of the invention is to provide a heterostructure forming an epitaxy substrate that allows the aforementioned problems of the prior art to be solved and can be used to obtain, by epitaxial growth, a material having no or few defects or dislocations.

One particular object of the invention is to provide a heterostructure allowing III/N materials to be obtained in the at least partially relaxed state, it being possible for these materials to be used subsequently as an epitaxy substrate for obtaining III/N materials in the at least partially relaxed state.

An additional object of the invention is to provide a process for fabricating this type of hetero structure.

For this purpose, the invention relates to a process for fabricating a heterostructure intended to be used in the fields of electronics, optoelectronics, optics or photovoltaic components, which heterostructure comprises a multilayer stack in which the upper layer is a relaxed or partially relaxed crystalline thin film.

In accordance with the invention, this process comprises the following steps:
  a) a thin film of crystalline material in the strained state is deposited epitaxially on, or transferred onto, a substrate called the "intermediate substrate";
  b) a layer of crystalline material, called the "strain relaxation layer," is deposited on the thin film, the material constituting the relaxation layer being chosen so as to be plastically deformed by a heat treatment at a temperature called the "relaxation temperature," at which temperature the material constituting the thin film deforms by elastic deformation;
  c) the assembly made up of the thin film and the relaxation layer is transferred onto a substrate, called the "mechanical support substrate," so as to form an intermediate heterostructure; and
  d) a thermal budget is applied to the intermediate heterostructure in order to bring it to at least the relaxation temperature, so as to cause the plastic deformation of the relaxation layer of crystalline material and the at least partial relaxation of the thin film by elastic deformation, and thus to obtain the final heterostructure.

According to other advantageous and non-limiting features of the invention, taken individually or in combination:
  application of the thermal budget of step d) results in the complete relaxation of the thin film by elastic deformation;
  the thickness of the relaxation layer is at least equal to the length of the deformation of the thin film when the latter relaxes by elastic deformation;
  prior to step d), an etching step is carried out in the thickness of the thin film in order to form islands of material therein;
  during step a), the thin film is transferred onto the intermediate substrate, being first epitaxially deposited on a substrate, called an "initial epitaxy substrate," so as to be in the strained state, and then transferred onto the intermediate substrate;
  the transfer of the thin film onto the intermediate substrate is effected by the implantation of ionic species through the thin film so as to form a weakened zone within the initial epitaxy substrate, this weakened zone defining a negative, then by the bonding of the strained thin film to the intermediate substrate and by a detachment of the negative from the initial epitaxy substrate by applying an energy budget;
  the thin film is deposited on the intermediate substrate and the material constituting the thin film has a lattice parameter that differs by at least 0.13% from that of the material of the intermediate substrate;
  the material constituting the thin film has a lattice parameter that differs by at least 0.13% from that of the material of the initial epitaxy substrate;
  step a) is carried out by the thin film being transferred onto or deposited on the intermediate substrate, the latter being a removable substrate;
  the thermal budget of step d) is applied by epitaxially depositing an epilayer on the thin film;
  the epilayer comprises an active layer;
  the thin film is made of a single-crystal material;
  the relaxation layer is made of a material chosen from silicon, germanium, indium phosphide and gallium arsenide;
  the thin film is made of a material of the III/N type; and
  the upper face of the film has the polarity of the III element.

The invention also relates to a heterostructure intended to be used in the fields of electronics, optoelectronics, optics or photovoltaic components.

In accordance with the invention, it includes a strain relaxation layer made of crystalline material, interposed between a mechanical support substrate and a thin film of crystalline material in the strained state, the material constituting the strain relaxation layer being chosen so as to deform plastically by a heat treatment at a temperature called the "relaxation temperature," at which temperature the material constituting the thin film deforms by elastic deformation and the thickness of the relaxation layer is at least equal to the length of the deformation of the thin film when the latter relaxes by elastic deformation.

According to other advantageous and non-limiting features of the invention, taken individually or in combination:
  it includes a strain relaxation layer made of plastically deformed crystalline material, interposed between a mechanical support substrate and a thin film of relaxed or partially relaxed crystalline material;
  the thin film is in direct contact with the strain relaxation layer;
  it includes at least one epilayer made of a material in the relaxed state on the thin film, the latter being made of single-crystal material;
  the thin film is made of a material of the III/N type;
  the upper face of the thin film has the polarity of the III element;
  the relaxation layer is made of a material chosen from silicon, germanium, indium phosphide and gallium arsenide; and
  the thin film is made of InGaN and the strain relaxation layer is made of germanium.

The process according to the invention includes a first step in which a thin film 5 of crystalline material in the strained state is deposited on or transferred onto a substrate 2 called the "intermediate substrate," as shown in FIG. 1D.

There are various possible ways of achieving this result. One of them will now be described with reference to FIGS. 1A through 1C.

FIG. 1A shows a substrate 1 called an "initial epitaxy substrate," on a front face 11 of which a thin crystalline film 5 has been deposited. This thin crystalline film 5 was preferably deposited by heteroepitaxy with pseudomorphic growth so that this thin crystalline film 5 is in the strained state relative to the substrate 1.

As a reminder, it will be recalled that a layer of material is in the "strained" state, in tension or in compression respectively, when its lattice parameter, in the plane of the interface with the material on which it rests, is respectively greater than or smaller than its nominal lattice parameter, i.e., its lattice parameter in the natural state.

In the present case, the materials constituting the thin crystalline film 5 and the initial epitaxy substrate 1 are preferably chosen so that the difference in their lattice parameters is at least 0.13% for reasons that will be explained later. This difference in lattice parameter corresponds here to that existing between the lattice parameter of InGaN containing 0.2% indium and that of relaxed GaN.

Also as a reminder, it will be recalled that the lattice parameters of a crystalline material correspond to the constant distances existing between the various atoms of a lattice of this material in three dimensions. They are denoted by a, b and c and are expressed in length units, generally in nanometers.

The parameters a and c correspond to the distances between atoms in the two directions of the interface plane between this material and its substrate, and the parameter b corresponds to the distance between atoms in a direction different from this plane.

When two materials have a difference in lattice parameter of at least 0.13%, for example, in their interface plane, this means that if the first material has lattice parameters a and c in this plane of lengths $l_a$ and $l_c$ respectively, then the second material has lattice parameters a' and c' having lengths of $l_{a'}$ and $l_{c'}$ respectively, where:

$$l_a \leq l_a-(0.13 \times l_a)/100 \text{ or } l_a \geq l_a+(0.13 \times l_a)/100$$

and conversely:

$$l_c-(0.13 \times l_c)/100 \leq l_c \leq l_c+(0.13 \times l_c)/100.$$

Preferably, the thickness of the strained thin crystalline film 5 does not exceed the threshold thickness above which crystal defects appear, such as dislocations, fissures, cracks or even phase separation causing relaxation during the epitaxial growth or cooling of the multilayer stack at the end of the epitaxy. The fissures or cracks are generally due to the difference in the thermal expansion coefficient of the materials constituting the initial epitaxy substrate 1 and the thin crystalline film 5, while the phase separation is due to the structural instability of certain strained materials.

It will be noted that the force of the strain induced in the thin crystalline film 5 is also proportional to the strained volume (diameter×thickness in the case of a cylindrical film). The stored elastic energy also depends on the Young's modulus of the material in question.

The material constituting the thin crystalline film 5 is a single-crystal or polycrystalline material. It may be chosen from the materials commonly used in electronics, for example, semiconductor materials. If, as explained above, the heterostructure fabricated by the process according to the invention has in particular the purpose of allowing subsequent homoepitaxy of III/N materials, the thin crystalline film 5 will advantageously be chosen from one of these materials and will be a single-crystal material.

The material constituting the support substrate 1 will be chosen according to that of the thin crystalline film 5 so as to meet the aforementioned criteria, in particular in terms of lattice parameters and thermal expansion coefficient, in order to obtain the material in the strained state.

To give an example, when the thin crystalline film 5 consists of a III/N material, the substrate 1 consists, for example, of silicon, SiC, sapphire, ZnO, MgO or GaN. It is also conceivable to have an intermediate layer between the substrate 1 and the epitaxially grown thin crystalline film 5, such as, for example, GaN on sapphire. The substrate 1 may be a bulk material or a multilayer material, its upper layer at the interface with the thin crystalline film 5 then having to meet the abovementioned criteria.

Preferably, as shown in FIG. 1B, the strained thin crystalline film 5 is transferred onto an intermediate substrate 2 using the technology known by the trademark SMART-CUT®. To do this, one or more ionic species are implanted through the thin crystalline film 5 so as to create a weakened zone 10 in the initial epitaxy substrate 1. This weakened zone 10 delimits a film 13 from a remainder 14 of the substrate 1, called the negative.

Advantageously, the thin crystalline film 5 may be covered with an oxide layer (not shown in FIG. 1B), which prevents damage and contamination of the implanted surface, and also provides a channelling effect of the implanted species. The thin crystalline film 5, whether or not it is covered with an oxide layer, is then prepared for being bonded to the intermediate substrate 2. To do this, the two substrates 1 and 2 are brought into intimate contact. It should be noted that a bonding layer 71 may be interposed between the two substrates 1 and 2, this bonding layer 71 possibly being deposited either on the intermediate substrate 2 or on the thin crystalline film 5, or on both of these.

As shown in FIG. 1D, an energy budget is then applied to the aforementioned multilayer stack, so as to detach the negative 14 from the initial epitaxy substrate 1 in the weakened zone 10. The residual layer 13 of the substrate 1 then undergoes a polishing, chemical etching or grinding operation in order to free the surface of the thin crystalline film 5.

The nature and the thickness of the intermediate substrate 2 will be chosen so as to have sufficient mechanical strength for transferring the thin crystalline film 5. In an alternative embodiment (not shown in the figures), the thin crystalline film 5 in the strained state could be transferred onto an intermediate substrate 2 of the "removable substrate" type.

The term "removable substrate" is understood to mean any type of substrate that can be easily detached from the thin crystalline film 5. Such an intermediate substrate may have the "removable" character because it includes, for example, a weakened layer or a layer capable of being selectively etched.

As shown in FIG. 1E, the process then continues with the deposition of a layer 6 of crystalline material, called a "strain relaxation layer" on the thin crystalline film 5. The material constituting the strain relaxation layer 6 is chosen so as to be plastically deformed by a heat treatment at what is called the "relaxation temperature," at which the material constituting the thin crystalline film 5 itself deforms elastically, so as to prevent the formation in the thin crystalline film 5 of crystal defects typically associated with a plastic deformation. The elastic deformation of the strained thin crystalline film 5 results in at least partial relaxation.

Although the relaxation of a film can take place by elastic and/or plastic deformation, the object of the invention is to obtain the at least partial relaxation of the strained thin crystalline film 5 only by elastic deformation. The term "plastic deformation" is understood to mean an irreversible deformation of the material, which takes place, for example, by the generation of defects and/or fissures. These concepts will be discussed in detail later.

It should be noted that the difference between the lattice parameter of the material constituting the thin crystalline film 5 and that constituting the strain relaxation layer 6 is of little importance, since the crystalline quality of the strain relaxation layer 6 has little impact on the relaxation of the material of the strained thin crystalline film 5. The material of the strain relaxation layer 6 may be a single-crystal material and may contain many defects, but it is preferably a polycrystalline material. When this material is polycrystalline, the grain boundaries react as free surfaces and facilitate the diffusion of atoms and the formation of defects leading to the plastic deformation of the strain relaxation layer 6.

Preferably, the thickness of the strain relaxation layer 6 is at least equal to the length of the deformation of the thin crystalline film 5 when the latter, which was strained, deforms elastically (i.e., when it relaxes), as will be described later. To give an example, if the lattice parameter of the thin crystalline film 5 differs by 0.5% from its nominal lattice parameter and if it has a diameter of 5 mm, it will elongate by 0.025 mm once in the relaxed state. The strain relaxation layer 6 therefore preferably has a thickness of at least 0.025 mm. Preferably, when the thin crystalline film 5 is made of a III/N material, the strain relaxation layer 6 is made of a material chosen from silicon, germanium, indium phosphide and gallium arsenide.

The strain relaxation layer 6 is then prepared for being bonded to a mechanical support substrate 3 as shown in FIG. 1F. The mechanical support substrate 3 is advantageously covered with a bonding layer 72, for example an oxide layer.

Next, it is advantageous to carry out a heat treatment to enhance the bonding, followed by detachment of the intermediate substrate 2, as shown in FIG. 1G. This detachment step may be carried out by etching the intermediate substrate 2, but in this case the substrate will be destroyed. It will be preferable to etch the bonding layer 71. As shown in FIG. 1G, it will be noted that when the intermediate substrate 2 has been detached, the strained thin crystalline film 5 has, on one side, a free upper face 51 and, on the other side, an opposed face 52 in contact with the strain relaxation layer 6, in such a way that this thin crystalline film 5 has a strong tendency to relax, this having the effect of straining the strain relaxation layer 6. What is obtained is the intermediate heterostructure 8.

As shown in FIG. 1H, a thermal budget called a "relaxation budget" is then applied to this heterostructure 8 so as to bring it to at least the relaxation temperature. As a reminder, it will be recalled that a thermal budget corresponds to a heat treatment temperature for the period of application of this treatment. The thermal budget is applied at least at the relaxation temperature and for the time needed to cause the plastic deformation of the strain relaxation layer 6 of crystalline material and the elastic deformation, for at least partial relaxation, of the thin crystalline film 5. This time may be shortened if the temperature of the applied heat treatment is increased.

The term "partial relaxation" is understood to mean that the elastic deformation of the material does not allow its nominal lattice parameter to be reached, to within the measurement uncertainties. The relaxation of the thin crystalline film 5 may also be complete. A layer of material is said to be in the "relaxed state" if its lattice parameter corresponds to its nominal lattice parameter, taking into account the measurement uncertainties and the measurement method used.

To obtain plastic deformation, the relaxation layer materials are heated to the following temperatures: at least 700° C. in the case of silicon; 600° C. in the case of germanium; 500° C. in the case of gallium arsenide; and 500° C. in the case of indium phosphide. The times for which these temperatures are applied can be easily determined by a person skilled in the art, these varying from a few seconds to a few hours respectively.

Following the application of this heat treatment, the strain relaxation layer 6 deforms plastically, as explained above, for example, via the generation of defects or fissures. Conversely, the thin crystalline film 5 relaxes by elastic deformation, without the formation of dislocations, until a strain energy balance is achieved and dislocations are formed in the material of the strain relaxation layer 6, the balance being achieved when the strain energy of the thin crystalline film 5 is no longer sufficient to form new dislocations during the heat treatment.

A relaxation saturation phenomenon may also take place. Dislocations are formed and relax the strain up to a certain threshold, which is reached when the dislocations come together in the crystal and are annihilated, improving the crystalline cohesion. Relaxation by dislocation growth is therefore at saturation.

The thin crystalline film 5 is considered to deform elastically as it could in theory return to its initial state, unlike the strain relaxation layer 6, if the strains exerted by the thin crystalline film 5 disappear. Once the temperature has returned to the initial temperature after applying the thermal budget, the material of the strain relaxation layer 6 can no longer return to its initial state as it has undergone a plastic deformation, and thus the thin crystalline film 5 remains in the relaxed or partially relaxed state. What is thus obtained is the final hetero structure 8'.

The process according to the invention has the advantage that the thin crystalline film 5 relaxes by the formation of dislocations in the strain relaxation layer 6 and not in the thin crystalline film 5, unlike in the case where a thin film is formed epitaxially, directly on a layer that has a different lattice parameter. Due to the process according to the invention, the thin crystalline film 5 is relaxed in the final state and it also has the desired crystalline quality, which quality is desired in particular for a high-quality epitaxy to be subsequently carried out in order to deposit active layers of optoelectronic or photovoltaic components, or else to form electronic devices.

According to a variant of the process, a step of forming trenches in the thickness of the thin crystalline film 5 may be carried out before the relaxation heat treatment. This step may be performed by etching and results in the formation of islands of materials in the thin crystalline film 5. The size of these islands may vary, for example, from 100 μm×100 μm to several mm².

This technique prevents any pleating of the thin crystalline film 5 occurring during the relaxation. Pleating occurs in particular when the thin crystalline film 5 is initially highly strained. Moreover, the formation of islands enables the thickness of the strain relaxation layer 6 to be reduced to the deformation of each of the islands rather than to the total deformation of the thin crystalline film 5.

The process according to the invention is also advantageous in that a double transfer of the thin crystalline film 5 is used. This is because, in the particular case in which the thin crystalline film 5 consists of a polar III/N material, for example, indium gallium nitride (InGaN), and when the material of this thin crystalline film 5 has an upper face 51 with the polarity of gallium or the polarity of the III element at the end of the first epitaxy carried out in FIG. 1A, the double transfer of the subsequent film makes it possible to have the upper face 51 with the polarity of gallium or of the III element on the top of the heterostructure 8 or 8' obtained, this polarity being more favorable to subsequent epitaxial regrowth.

If the material of the thin crystalline film 5 is not polar, it is unnecessary to carry out the double transfer. It is then possible to deposit the thin crystalline film 5 directly on the intermediate substrate 2 by epitaxy. This epitaxy on the intermediate substrate 2 makes it possible to avoid having to transfer the epitaxially grown thin crystalline film 5 firstly to the substrate 1. In this case, the intermediate substrate 2 will be chosen so that it preferably has a lattice parameter mismatch with the material of the thin crystalline film 5 of at least 0.13%. The strain relaxation layer 6 is then deposited on the thin crystalline film 5, and then the thin crystalline film 5 and the strain relaxation layer 6 are transferred onto the final mechanical support substrate 3, before the relaxation treatment is carried out.

The lattice parameter mismatch of 0.13% between the thin crystalline film 5 and the initial epitaxy substrate 1, or between the thin crystalline film 5 and the intermediate substrate 2 when thin crystalline film 5 is deposited directly on it (and not transferred), ensures sufficient elastic energy and force within the thin crystalline film 5 to cause it to relax after the relaxation thermal budget has been applied. It will be noted that, in the case in which the thin crystalline film 5 has firstly been deposited epitaxially on the substrate 1, it is unnecessary when transferring it onto the intermediate substrate 2 for the latter to have a lattice parameter mismatch of at least 0.13%.

As explained above, the final heterostructure 8' obtained may advantageously be used as an epitaxy substrate. Two alternative ways of carrying out this epitaxy will now be described in conjunction with FIGS. 2A to 2D and 3A to 3C. The epitaxy may be formed with a material differing in nature from the material of the thin crystalline film 5.

Figure 2B:
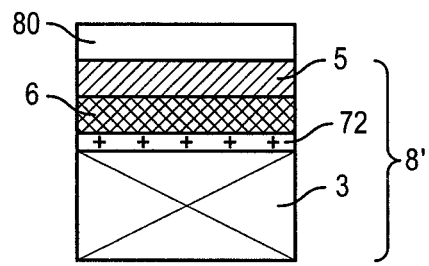
Figure 2C:
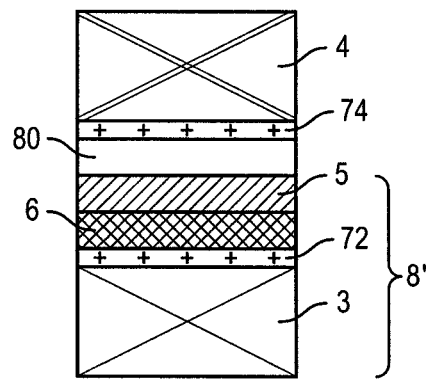
Figure 2D:
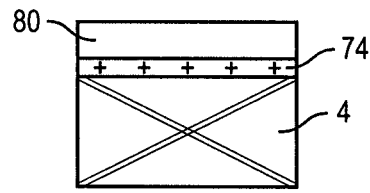

As may be seen in FIG. 2B, a layer of material 80, called an "epilayer," can be epitaxially deposited on the thin crystalline film 5 of the final heterostructure 8'. The thin crystalline film 5 then serves as a seed film. Preferably, the material of the epilayer 80 has a lattice parameter close to that of the thin crystalline film 5, preferably with a lattice parameter difference of less than 0.5%. More preferably, the epilayer 80 is a homoepitaxial layer.

It is sometimes necessary for the thin crystalline film 5 to have a low dislocation density so as to obtain a layer of material 80 having good crystallinity, that is to say, a low defect density. In this case, and provided that the lattice parameters of the thin crystalline film 5 are close to those of the epilayer 80, it is possible to obtain an epilayer 80 with an advantageously low dislocation density, i.e., in the case of GaN for example, less than $10^7$ dislocations/cm$^2$. For a material such as InGaN with an indium content of 10%, the dislocation density may be less than $5\times10^8$ dislocations/cm$^2$. Also advantageously, the thermal expansion coefficient of the mechanical support substrate 3 is chosen so as to be close to that of the epilayer 80 so as to prevent fissures during cooling.

If the thermal budget applied during the epitaxy of the layer 80 corresponds to that needed to cause plastic deformation of the strain relaxation layer 6 and elastic deformation of the thin crystalline film 5, as mentioned above, the epitaxy may be carried out on the intermediate heterostructure 8 shown in FIG. 2A. In this case, after the epitaxy, the heterostructure 8 becomes the final heterostructure 8' as shown in FIG. 2B.

The epilayer 80 may include at least one active layer. After the epitaxy, the layer 80 may be transferred onto a definitive substrate 4 using a bonding layer 74 and then the mechanical support substrate 3 can be removed, for example, using a mechanical thinning technique such as polishing. Subsequent finishing steps enable the thin crystalline film 5 and strain relaxation layer 6 to be removed (see FIG. 2D).

Figure 3A:
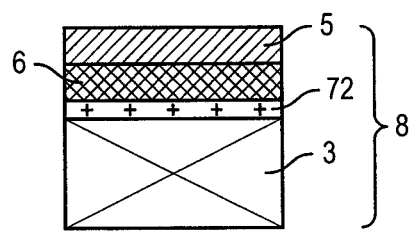
FIGS. 3A through 3C are diagrams showing the various successive steps of a second method of using the heterostructure according to the invention.
Figure 3B:
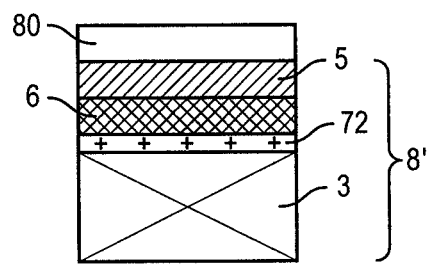
Figure 3C:
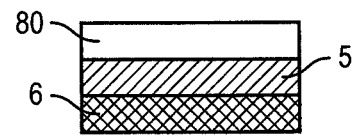

Another implementation method, shown in FIGS. 3A through 3C, differs from that which has just been described in that the thickness of the assembly comprising the thin crystalline film 5, the strain relaxation layer 6 and the epilayer 80 is sufficient to be self-supporting. In this case, the mechanical support substrate 3 is removed, for example by polishing or any other technique well known to those skilled in the art and appropriate for this removal.

One particular exemplary embodiment of the invention will now be described. A thin indium gallium nitride (InGaN) crystalline film 5 containing 10% indium is deposited epitaxially on an epitaxy substrate 1, consisting of sapphire covered with a gallium nitride (GaN) layer. This epitaxy is continued until the thin InGaN crystalline film 5 reaches a thickness of 50 nanometers. This film has a lattice parameter difference of about 1% from that of the gallium nitride on which it rests.

The diameter of the thin InGaN crystalline film 5 is 50.8 mm (or 2 inches). It has a dislocation density of less than $5\times10^8$/cm$^2$.

An SiN layer is then deposited on the thin InGaN crystalline film 5 and then covered with an SiO$_2$ bonding layer 71, before it is bonded to a substrate 2.

Next, hydrogen ions or hydrogen and helium ions are implanted with a total dose of between $2.5\times10^{17}$ atoms/cm$^2$ and $6\times10^{17}$ atoms/cm$^2$ into the GaN through the thin InGaN crystalline film 5, to form therein a weakened zone 10.

Next, that surface of the thin InGaN crystalline film 5 that is covered with the SiN and SiO$_2$ layers is bonded to a sapphire intermediate substrate 2. A fracture thermal budget is applied to this structure and the 50-nanometer-thin InGaN crystalline film 5 is transferred onto the intermediate substrate 2.

After removing the residual GaN from the thin InGaN crystalline film 5, a polycrystalline germanium strain relaxation layer 6 is then deposited on the thin InGaN crystalline film 5, which has a nitrogen polarity, until a thickness of at least 10 microns is reached.

Next, a possible SiN adhesion layer is deposited thereon, followed by a silicon oxide bonding layer 72.

Moreover, a final sapphire mechanical support substrate 3 is prepared, sapphire being chosen as it has a thermal expansion coefficient matched to the envisaged subsequent epitaxy. An SiO$_2$ bonding layer is also deposited on this final mechanical support substrate 3. The surfaces to be mated are planarized and then brought into contact so as to carry out the bonding.

Next, the sapphire intermediate substrate 2 is removed by etching the SiO$_2$ bonding layer, so as to detach this substrate 2. The upper face 51 of the thin InGaN crystalline film 5 of gallium polarity is cleaned of the residues of the bonding layer 71.

An etching step is then carried out over the thickness of the thin InGaN crystalline film 5 in order to form InGaN islands measuring 100 µm×100 µm.

Next, an 800° C./4-hour thermal budget is applied to the heterostructure 8 obtained, until the strain relaxation layer 6 undergoes plastic deformation and the thin InGaN crystalline film 5 undergoes complete relaxation.

An epilayer 80 of indium gallium nitride with a 10% indium content is formed on the thin InGaN crystalline film 5 so as to obtain a high-quality material having a dislocation density of less than $5\times10^8$/cm$^2$.

What is claimed is:

1. A heterostructure for use in at least one of an electronic device, an optoelectronic device, an optic device, and a photovoltaic device, the heterostructure comprising:
   a mechanical support substrate;
   a thin film of crystalline III/N semiconductor material in an at least partially relaxed state;
   a plastically deformed strain relaxation layer comprising a crystalline material, the strain relaxation layer interposed directly between the mechanical support substrate and the thin film of crystalline III/N semiconductor material, the crystalline material of the strain relaxation layer being plastically deformed by a heat treatment at a relaxation temperature at which the crystalline III/N semiconductor material of the thin film elastically deformed to at least partially relax the thin film, a thickness of the strain relaxation layer being at least equal to a length of the elastic deformation of the thin film; and
   an active layer epitaxially deposited on the at least partially relaxed layer of crystalline III/N semiconductor material of the thin film.

2. The heterostructure of claim 1, wherein the active layer comprises a material in a relaxed state on the thin film of crystalline III/N semiconductor material, and wherein the crystalline III/N semiconductor material of the thin film comprises a single-crystal.

3. The heterostructure of claim 1, wherein an upper face of the thin film has a polarity of a Group III element.

4. The heterostructure of claim 1, wherein the crystalline material of the strain relaxation layer comprises at least one of silicon, germanium, indium phosphide and gallium arsenide.

5. The heterostructure of claim 1, wherein the crystalline III/N semiconductor material of the thin film comprises InGaN and the crystalline material of the strain relaxation layer comprises germanium.

6. A heterostructure for use in at least one of an electronic device, an optoelectronic device, an optic device, and a photovoltaic device, the heterostructure comprising:
   a strain relaxation layer comprising a plastically deformed crystalline material, the strain relaxation layer interposed directly between a mechanical support substrate and a thin film of at least partially relaxed crystalline material, the crystalline material of the strain relaxation layer plastically deformed by a heat treatment at a relaxation temperature at which the crystalline material of the thin film elastically deformed, a thickness of the strain relaxation layer being at least equal to a length of a deformation of the thin film that occurred when the thin film at least partially relaxed by elastic deformation; and
   an active layer epitaxially deposited on the at least partially relaxed crystalline material of the thin film.

7. The heterostructure of claim 6, wherein the active layer comprises a material in a relaxed state on the thin film of crystalline material, and wherein the crystalline material of the thin film comprises a single-crystal.

8. The heterostructure of claim 6, wherein the crystalline material of the thin film comprises a III/N material.

9. The heterostructure of claim 8, wherein an upper face of the thin film has a polarity of a Group III element.

10. The heterostructure of claim 6, wherein the crystalline material of the strain relaxation layer comprises at least one of silicon, germanium, indium phosphide and gallium arsenide.

11. The heterostructure of claim 6, wherein the crystalline material of the thin film comprises InGaN and the crystalline material of the strain relaxation layer comprises germanium.

* * * * *